United States Patent [19]
Sugibayashi

[11] Patent Number: 5,373,477
[45] Date of Patent: Dec. 13, 1994

[54] INTEGRATED CIRCUIT DEVICE HAVING STEP-DOWN CIRCUIT FOR PRODUCING INTERNAL POWER VOLTAGE FREE FROM OVERSHOOT UPON VOLTAGE DROP OF EXTERNAL POWER VOLTAGE

[75] Inventor: Tadahiko Sugibayashi, Tokyo, Japan

[73] Assignee: NEC Corporation, Tokyo, Japan

[21] Appl. No.: 9,974

[22] Filed: Jan. 26, 1993

[30] Foreign Application Priority Data

Jan. 30, 1992 [JP] Japan .................................. 4-014404

[51] Int. Cl.[5] .............................................. G11C 5/14
[52] U.S. Cl. ............................. 365/226; 365/189.07; 365/189.09; 365/189.11; 365/210; 327/541
[58] Field of Search ............. 365/226, 189.07, 189.09, 365/207, 210, 227, 228, 189.11; 307/296.1, 296.3, 296.6

[56] References Cited

U.S. PATENT DOCUMENTS 5,077,518  12/1991  Han ..................................... 365/226
5,121,007  6/1992  Aizaki ........................ 365/189.11 X

OTHER PUBLICATIONS

Nakagome et al., "Low-Voltage Circuit Technology for 64 Mb DRAMs," IEICE Technical Report, ICD-90-200, pp. 7–13, Mar. 27, 1991.

Primary Examiner—Eugene R. LaRoche
Assistant Examiner—Huan Hoang
Attorney, Agent, or Firm—Foley & Lardner

[57] ABSTRACT

A dynamic random access memory device is equipped with an internal power supply system for selectively distributing a step-down power voltage to internal component circuits, and the internal power supply system comprises a feedback loop for regulating the step-down power voltage on an internal power supply line to a reference voltage, a voltage detecting circuit monitoring an internal power voltage line to see whether or not the step-down power voltage is decayed to a critical level for producing a gate control signal, and an auxiliary variable load transistor coupled between the external power supply line and the internal power supply line and responsive to the gate control signal for supplementing current to the internal power supply line, wherein the critical level is inversely proportional to the external power voltage while the external power voltage is higher than the reference voltage, thereby preventing the step-down power voltage from undesirable overshoot upon production of the gate control signal.

5 Claims, 7 Drawing Sheets

INTEGRATED CIRCUIT DEVICE HAVING STEP-DOWN CIRCUIT FOR PRODUCING INTERNAL POWER VOLTAGE FREE FROM OVERSHOOT UPON VOLTAGE DROP OF EXTERNAL POWER VOLTAGE

FIELD OF THE INVENTION

This invention relates to an integrated circuit device and, more particularly, to an ultra large scale integration such as, for example, a dynamic random access memory device equipped with an internal step-down circuit.

DESCRIPTION OF THE RELATED ART

Figure 1:
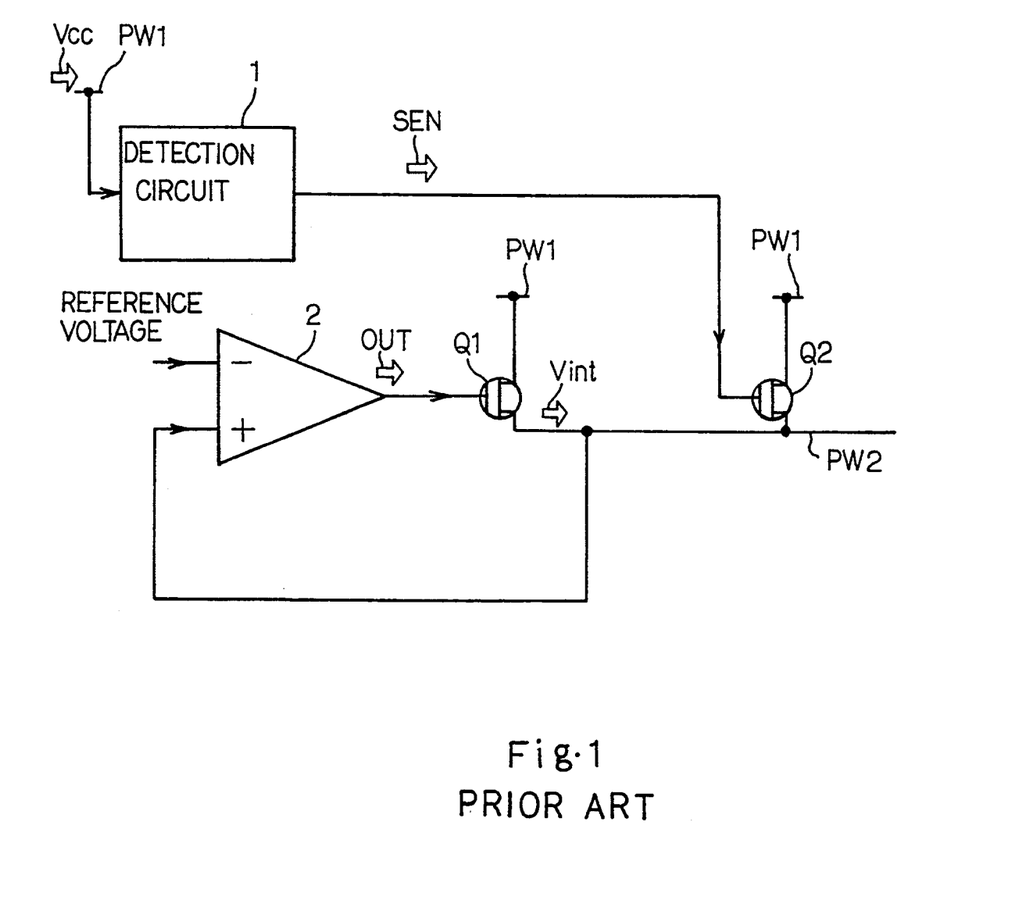
FIG. 1 is a circuit diagram showing the internal power supply system incorporated in the prior art dynamic random access memory device.
Figure 2:
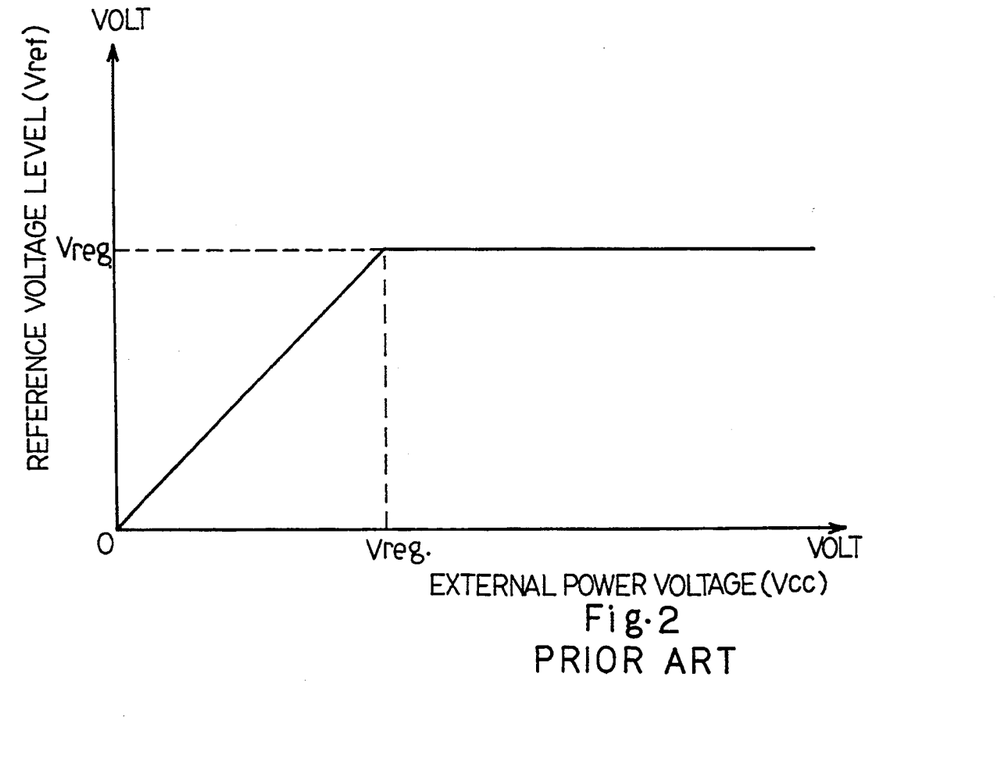
FIG. 2 is a graph showing the relation between the reference voltage signal and the external power voltage level after the prior art dynamic random access memory device is powered.

A typical example of the dynamic random access memory device is disclosed by Nakagome et al. in "Low-voltage Circuit Technology for 64 Mb DRAMs", IEICE Technical Report, ICD90-200, pages 7 to 13. FIG. 1 illustrates an internal power circuit incorporated in the dynamic random access memory device disclosed in the paper. The internal power circuit comprises a detection circuit 1 coupled with a power supply line PW1, a voltage comparator 2 for comparing an internal power voltage Vint with a reference voltage level Vref, a p-channel enhancement type variable load transistor Q1 controlled by the voltage controller 2, and a p-channel enhancement type variable load transistor Q2 controlled by the detection circuit 1. The detection circuit I monitors external power voltage Vcc on the power supply line PW1, and produces a gate control signal SEN when the external power voltage Vcc is decayed below a predetermined voltage level Vsen. On the other hand, the reference voltage level Vref is directly produced from the external power voltage Vcc by means of, for example, a voltage divider (not shown). FIG. 2 illustrates the relation between the external power voltage Vcc and the reference voltage level Vref. When the dynamic random access memory device is powered with the external power voltage Vcc, the reference voltage level Vref rises together with the external power voltage Vcc on the power supply line PW1, and is saturated at a target voltage level Vreg. Therefore, the reference voltage level Vref is kept constant in so far as no turbulence takes place on the external power supply system.

Figure 3:
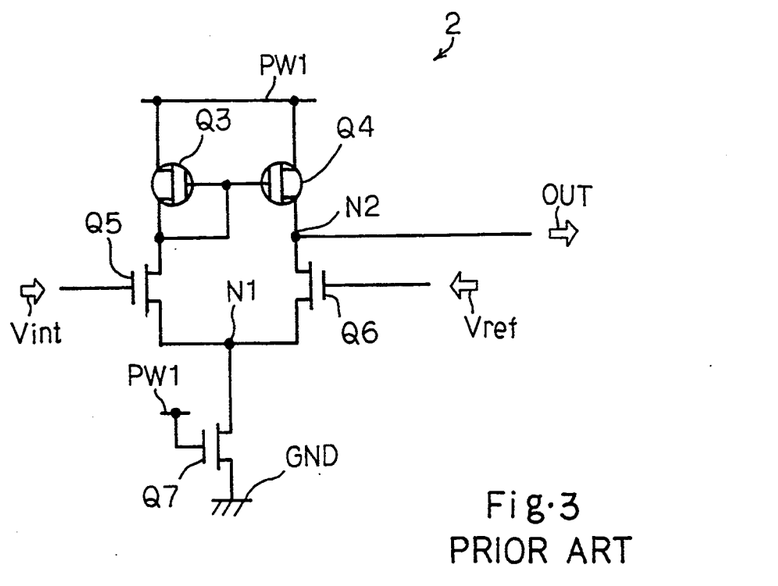
FIG. 3 is a circuit diagram showing the circuit arrangement of the voltage comparator incorporated in the prior art dynamic random access memory device.

The voltage comparator 2 is implemented by a current mirror amplifier as shown in FIG. 3, and comprises two series combinations of p-channel enhancement type load transistor Q3 and Q4 and n-channel enhancement type input transistors Q5 and Q6 coupled in parallel between the power supply line PW1 and a common node N1. An n-channel enhancement type current source transistor Q7 is coupled between the common node N1 and a ground voltage line GND. The p-channel enhancement type load transistors Q3 and Q4 have respective gate electrodes coupled with the drain node of the p-channel enhancement type load transistor Q3, and the drain node of the other p-channel enhancement type load transistor Q4 serves as an output node N2 where a gate control signal OUT takes place. The gate electrode of the n-channel enhancement type current source transistor Q7 is coupled with the power supply line PW1, and allows constant current to flow therethrough. The reference voltage level Vref is applied to the gate electrode of the n-channel enhancement type input transistor Q6, and the internal power voltage Vint is applied to the gate electrode n-channel enhancement type input transistor Q5. The n-channel enhancement type input transistors Q5 and Q6 convert the differential voltage between the reference voltage level Vref and the internal power voltage Vint to the gate voltage of the p-channel enhancement type load transistors Q3 and Q4, and channel resistances of the p-channel enhancement type load transistors Q3 and Q4 are equally varied. This results in variation of the gate control signal OUT.

Turning back to FIG. 1, the gate control signal OUT is supplied from the voltage comparator 2 to the gate electrode of the p-channel enhancement type variable load transistor Q1 so as to provide variable resistance against current from the power supply line PW1 to the power supply line PW2. If the internal power voltage Vint goes down from the target level Vreg, the voltage comparator 2 decreases the voltage level of the gate control signal OUT, and the p-channel enhancement type variable load transistor Q1 decreases the channel resistance thereof for increasing the voltage level of the internal power voltage level. On the other hand, when the internal power voltage Vint is elevated from the target level Vreg, the voltage comparator 2 lifts the voltage level of the gate control signal OUT for increasing the channel resistance, and the p-channel enhancement type variable load transistor Q1 causes the internal power voltage Vint to be recovered to the predetermined level.

While the reference voltage level Vref is kept at the target level Vreg, the feedback loop implemented by the variable load transistor Q1 and the voltage comparator 2 regulates the internal power voltage Vint to the reference voltage level Vref as described hereinbefore. However, if the external power voltage Vcc is undesirably decayed under the target level Vreg due to, for example, turbulence in the external power supply system, the undesirable voltage drop decreases the differential voltage between the source and drain of the p-channel enhancement type variable load transistor Q1. This means that the p-channel enhancement type variable load transistor Q1 decreases the current from the power supply line PW1 to the power supply line PW2. In order to supplement the current to the power supply line PW2, the detection circuit 1 detects the undesirable voltage drop on the power supply line PW1, and supplies the gate control signal SEN of the ground voltage level to the p-channel enhancement type variable load transistor Q2. Then, the p-channel enhancement type variable load transistor Q2 turns on, and supplements the current to the power supply line PW2. As a result, the internal power voltage Vint is regulated to the lowered external power voltage level Vcc. However, the p-channel enhancement type variable load transistor Q2 is large enough to keep the power voltage line PW2 at the lowered external power voltage level Vcc because of the gate control signal SEN of the ground voltage level.

Figure 4:
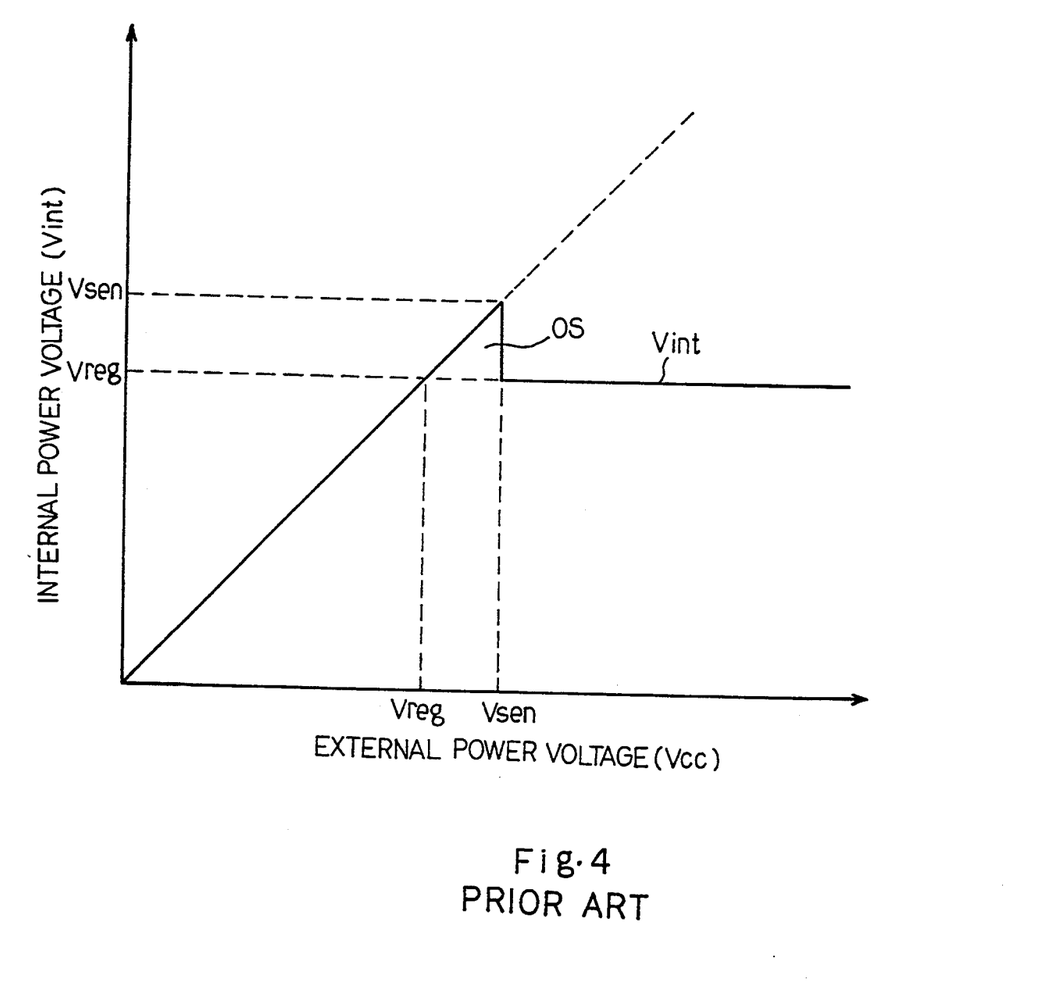
FIG. 4 is a graph showing the relation between the internal power voltage level and the external power voltage level when the external power voltage fluctuates.

However, a problem is encountered in the prior art dynamic random access memory device in that malfunction takes place in internal component circuits (not shown) powered with the internal power voltage Vint. The storage capacitor of the memory cell is one of the internal component circuits affectable by the voltage fluctuation of the internal power voltage Vint. In detail, when the external power voltage Vcc is decayed below the target level Vreg, the detection circuit I allows the p-channel enhancement type variable load transistor Q2 to supplement current to the power voltage line PW2. The detection circuit produces the gate control signal SEN when the external power voltage level Vcc is decayed under a critical level Vsen, and the critical level Vsen is slightly higher than the target level Vreg as shown in FIG. 4. Such a voltage margin between the critical level Vsen and the target level Vreg retards rapid voltage drop on the power supply line PW2. However, after the p-channel enhancement type variable load transistor Q2 turns on, the power supply line PW2 is dominated by the external power voltage level Vcc, and the power supply line PW2 is rapidly elevated to the voltage level equal to the critical level Vsen. If the external power voltage Vcc is continuously decreased from the critical level Vsen, the internal power voltage Vint follows the external power voltage Vcc, and the internal power voltage traces Plots Vint of FIG. 4. As a result, an overshoot OS takes place while the external power voltage vcc passes through the range between the critical level Vsen and the target level Vreg. The overshoot OS decreases voltage margin for the internal component circuits (not shown) powered with the internal power voltage Vint, and malfunction is liable to take place due to the loss of the voltage margin.

SUMMARY OF THE INVENTION

It is therefore an important object of the present invention to provide in an integrated circuit an internal power supply system of which does not produce any overshoot upon fluctuation of an external power voltage.

To accomplish the object, the present invention proposes to inverse-proportionally decrease a critical level with respect to an external power voltage for canceling overshoot of a step-down power voltage.

In accordance with the present invention, there is provided an integrated circuit device fabricated on a single semiconductor chip, comprising: a) a main circuit for achieving a predetermined function; and b) a power supply system associated with the main circuit, and comprising b-1) a reference voltage producing means for producing a reference voltage from an external power voltage on an external power supply line, b-2) a voltage comparator having a first input node supplied with the reference voltage and a second input node coupled with an output node thereof, and operative to produce a first gate control signal for eliminating difference between the reference voltage and voltage level at the output node, b-3) a first variable load transistor coupled between the external power supply line and an internal power supply line for producing a step-down power voltage, and responsive to the first gate control signal for changing channel resistance thereof, thereby keeping the step-down power voltage constant, b-4) a voltage detecting circuit monitoring the internal power supply line to see whether or not the step-down power voltage is decayed to a critical level, and operative to produce a second gate control signal when the step-down power voltage reaches the critical value, the critical level being inversely proportional to the external power voltage level while the external power voltage is higher than the reference voltage, and b-5) a second variable load transistor coupled between the external power supply line and the internal power supply line, and responsive to the second gate control signal for supplementing current to the internal power supply line.

The main circuit may be implemented by a dynamic random access memory cell array associated with peripheral circuits so as to write data bits into and read out the data bits from the dynamic random access memory cell array.

BRIEF DESCRIPTION OF THE DRAWINGS

The features and advantages of the integrated circuit device according to the present invention will be more clearly understood from the following description taken in conjunction with the accompanying drawings in which.

DESCRIPTION OF THE PREFERRED EMBODIMENT

Figure 5:
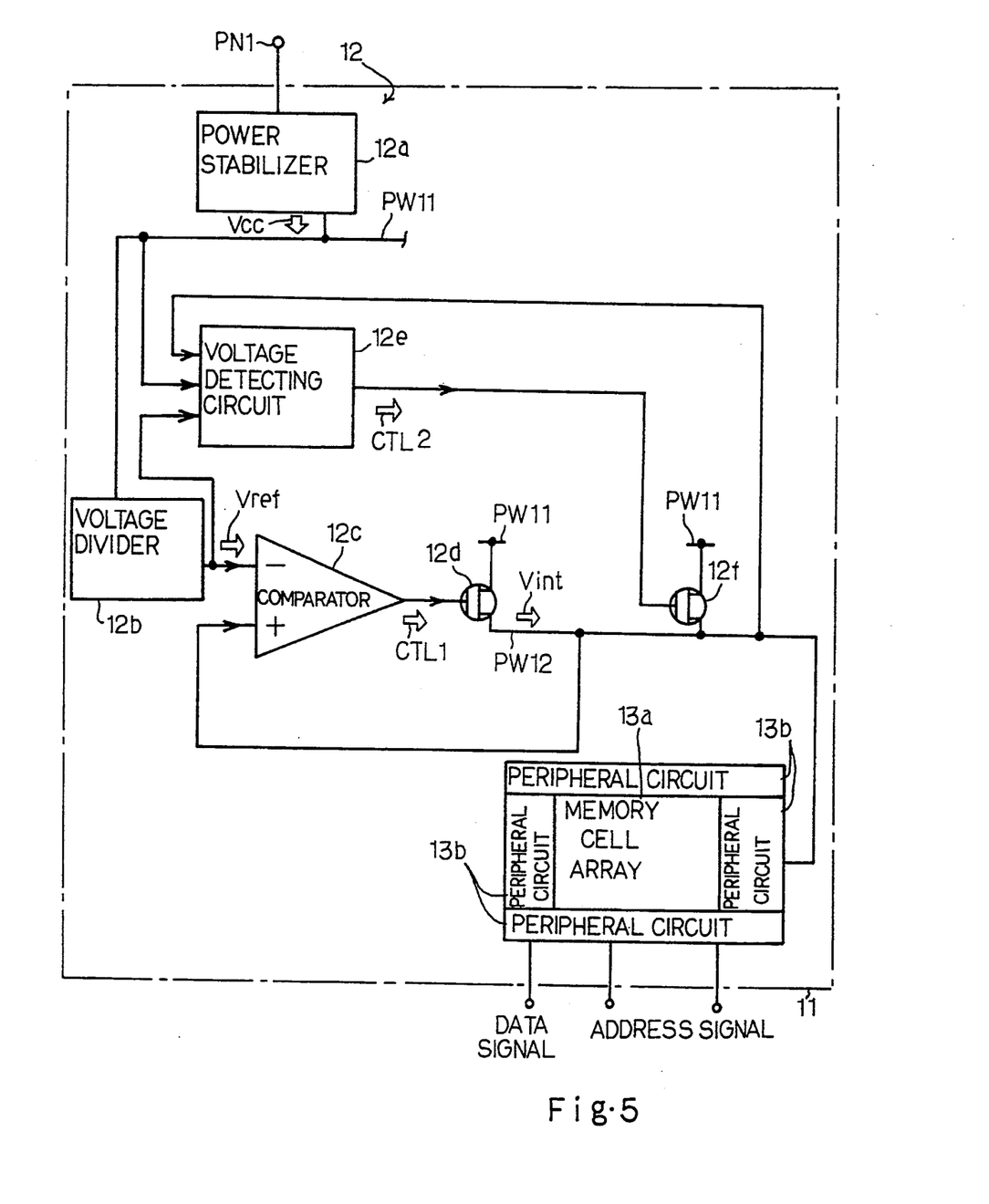
FIG. 5 is a circuit diagram showing the arrangement of a dynamic random access memory device according to the present invention.

Referring to FIG. 5 of the drawings, a dynamic random access memory device embodying the present invention is fabricated on a single semiconductor chip 11, and largely comprises an internal power supply system 12 for producing a step-down power voltage Vint and a dynamic random access memory cell array 13a accompanied with peripheral circuits 13b such as address decoders, a precharging circuit, sense amplifier circuits, a column selector and a data buffer circuit. The dynamic random access memory cell array 13a and the peripheral circuits 13b serve as a main circuit. However, they are well known to those skilled in the art, and no further description is incorporated hereinbelow.

The internal power supply system 12 comprises a power stabilizer 12a coupled with a power supply pin PN1, and the power stabilizer 12a distributes an external power voltage Vcc through an external power supply line PW11. The internal power supply system 12 further comprises a voltage divider 12b for producing a reference voltage Vref from the external power voltage Vcc, a voltage comparator 12c for producing a first gate control signal CTL1, and a p-channel enhancement type variable load transistor 12d for regulating a step-down power voltage Vint to the reference voltage Vref in cooperation with the voltage comparator 12c. The voltage divider is, by way of example, implemented by a resistor string, and allows the reference voltage Vref to follow the external power voltage Vcc. Namely, when the dynamic random access memory device is powered with the external power voltage Vcc at the power supply pin PN1, the reference voltage Vref rises together with the external power voltage Vcc without any substantial time delay. However, the reference voltage Vref is saturated at a predetermined level REF, and the external power voltage Vcc is further increased over the predetermined level REF. The voltage comparator 12c has an inverted input node (−) coupled with the output node of the voltage divider 12b, a non-inverted input node (+) coupled with the output node thereof, and is operative to compare the step-down power voltage Vint at the output node thereof with the reference voltage Vref. If the step-down power voltage Vint exceeds the predetermined level REF, the voltage comparator 12c increases the voltage level of the first gate control signal CTL1, and the p-channel enhancement type variable load transistor 12d increases the channel resistance thereof. As a result, the current from the external power supply line PW11 to the internal power supply line PW12 is decreased, and the step-down power voltage Vint is recovered to the predetermined level REF. On the other hand, if the step-down power voltage Vint goes down below the predetermined level REF, the voltage comparator 12c decreases the voltage level of the first gate control signal CTL1, and the p-channel enhancement type variable load transistor 12d decreases the channel resistance thereof. As a result, the current from the external power supply line PW11 to the internal power supply line PW12 is increased, and the step-down power voltage Vint is recovered to the predetermined level REF.

The internal power supply system 12 further comprises a voltage detecting circuit 12e for producing a second gate control signal CTL2 and a p-channel enhancement type variable load transistor 12f. As will be better seen from FIG. 6, the voltage detecting circuit 12e largely comprises a variable voltage generator 12g, and a voltage comparator unit 12h. The variable voltage generator 12g comprises a voltage divider 12i implemented by a series of resistors R1 and R2 coupled between the external power supply line PW11 and an output node thereof Nout, a voltage comparator 12j having an inverted input node (−) supplied with the reference voltage Vref and a non-inverted input node (+) coupled with a node N10 between the resistors R1 and R2, and a series combination of a p-channel enhancement type variable load transistor 12k and a resistor R3 coupled between the external power supply line PW11 and a ground voltage node GND. The resistance of each resistor R1 or R2 is much larger than that of the resistor R3, and a negligible amount of current passes from the power supply line PW11 through the resistors R1 and R2 to the output node Nout. The drain node of the variable load transistor 12k is coupled with the output node Nout, and the critical voltage Vik at the output node Nout is inversely proportional to the external power voltage level Vcc.

Figure 6:
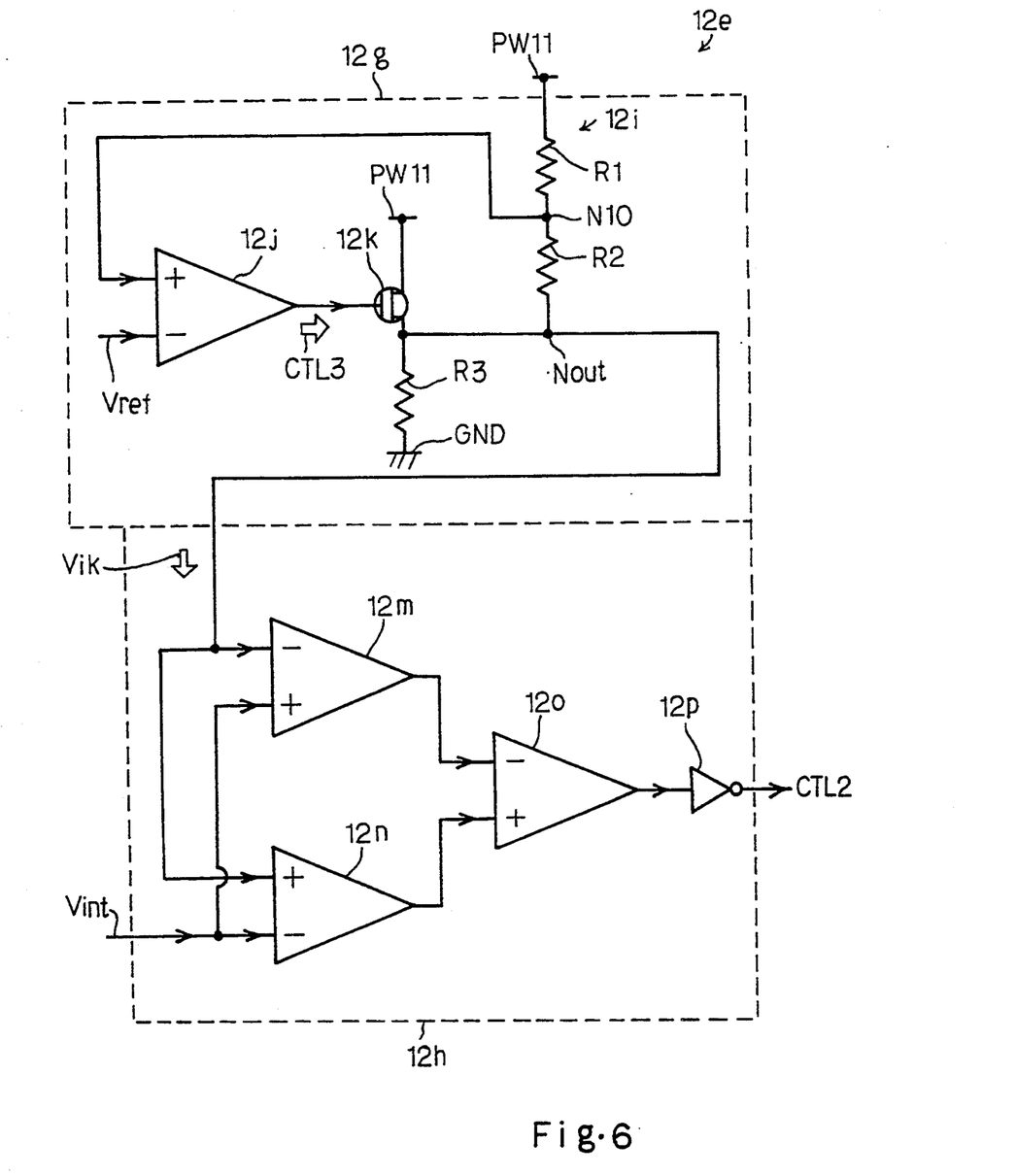
FIG. 6 is a circuit diagram showing the arrangement of a voltage detecting circuit incorporated in the dynamic random access memory device.
Figure 7:
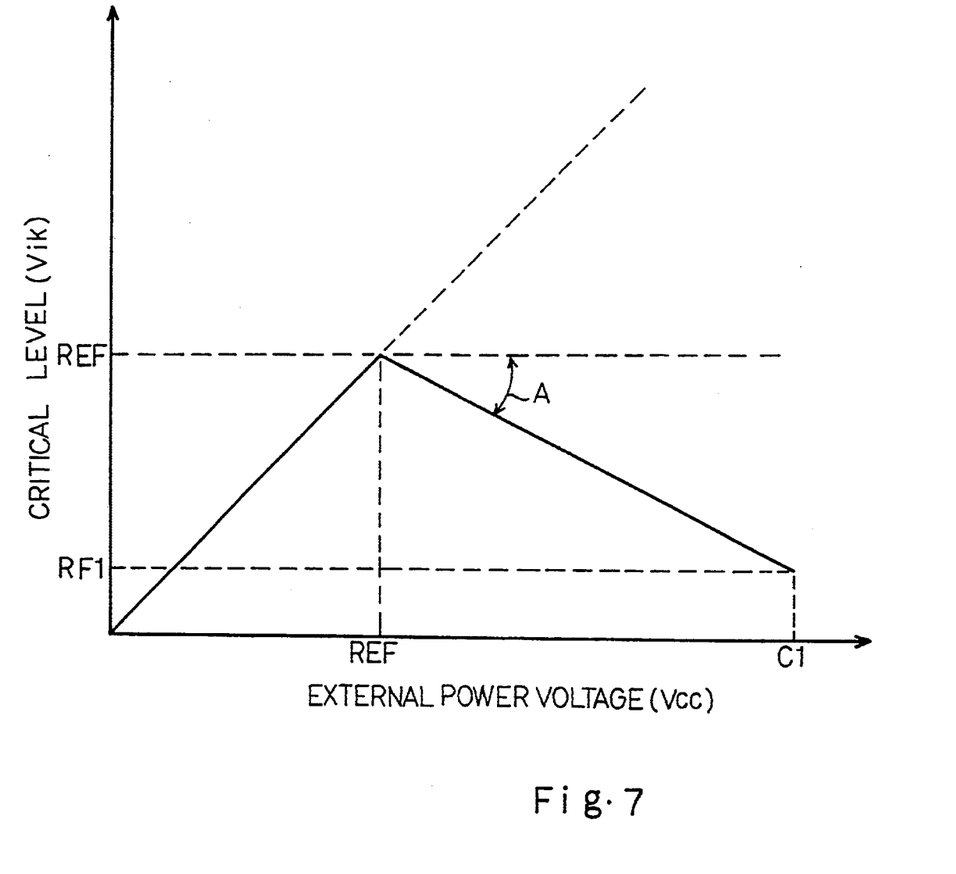
FIG. 7 is a graph showing relation between a critical level and an external power voltage.

The variable voltage generator 12g thus arranged behaves as follows. While the external power voltage Vcc is much higher than the reference level REF such as at C1 (See FIG. 7), the voltage comparator 12j supplies a gate control signal CTL3 indicative of large channel resistance, and the p-channel enhancement type variable load transistor 12k provides large channel resistance against current from the power Supply line PW11. As a result, the critical voltage Vik at the output node Nout is regulated to RF1. If the external power voltage Vcc becomes closer to the reference level REF, the voltage level at the node N10 is lowered together with the external power voltage Vcc, and the voltage comparator 12j decreases the voltage level of the gate control signal CTL3. The p-channel enhancement type variable load transistor 12k is responsive to the gate control signal CTL3, and decreases the channel resistance thereof. For this reason, the critical voltage Vik at the output node Nout goes up from the previous value RF1. Thus, while the external power voltage Vcc is higher than the reference level REF, the critical voltage Vik is inversely proportional to the external power voltage Vcc, and tangent A is determined by ratio between the resistance of the resistor R1 and the resistance of the resistor R2. In other words, tangent A is regulable by changing the ratio. While the reference voltage Vref rises together with the external power voltage Vcc, the critical voltage Vik is increased toward the reference level REF.

The voltage comparator unit 12h comprises three voltage comparators 12m. 12n and 12o and an inverter 12p, and the critical voltage Vik is supplied to the inverted input node (−) of the voltage comparator 12m and to the non-inverted input node (+) of the voltage comparator 12n. On the other hand, the step-down power voltage Vint is supplied to the non-inverted input node (+) of the voltage comparator 12m and to the inverted input node (−) of the voltage comparator 12n, and the output nodes of the voltage comparators 12m and 12n are respectively coupled with the inverted input node (−) and the non-inverted input node (+) of the voltage comparator 12o. The output node of the voltage comparator r 12o is coupled with the inverter 12p, and the inverter 12p supplies the second gate control signal CTL2 to the p-channel enhancement type variable load transistor 12f.

While the external power voltage Vcc is high enough to keep the internal power voltage Vint at the reference level REF, the voltage comparators 12m and 12n allows the voltage comparator 12o to produce an output voltage signal of low voltage level, and, accordingly, the inverter 12p supplies the second gate control signal CTL2 of high voltage level to the p-channel enhancement type variable load transistor 12f. The p-channel enhancement type variable load transistor is turned off, and the feedback loop regulates the step-down power voltage Vint on the power supply line PW12 to the reference level REF.

Figure 8:
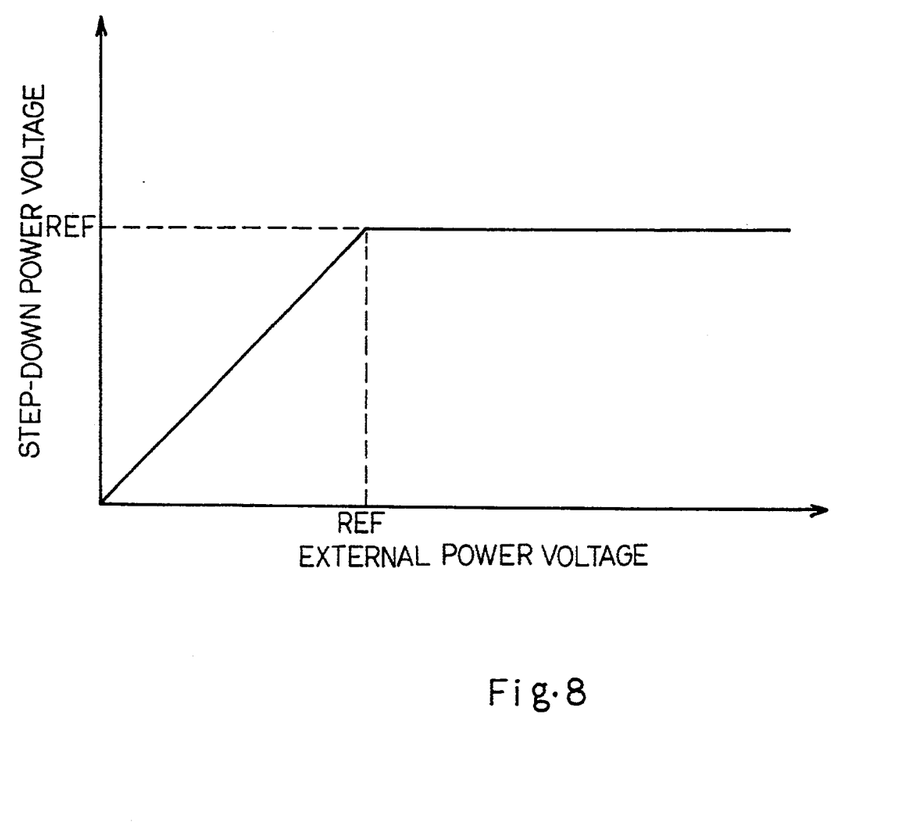
FIG. 8 is a graph showing relation between a step-down power voltage and the external power voltage.

However, if the external power voltage Vcc is decayed due to, for example, turbulence in an external power supply system (not shown), the variable voltage generator 12g produces the critical voltage Vik, and the critical voltage Vik has a certain value depending upon the external power voltage Vcc. When the step-down power voltage Vint reaches the certain level, the voltage comparators 12m and 12n causes the voltage comparator 12o to change the output voltage signal to the high voltage level, and the inverter 12p supplies the second gate control signal CTL2 of the low voltage level to the p-channel enhancement type variable load transistor 12f. The p-channel enhancement type variable load transistor 12f pulls up the power supply line PW12, and overshoot takes place in the step-down power voltage Vint. However, the difference between the external power voltage level Vcc and the reference value REF is canceled by the decrement of the step-down power voltage Vint, and the step-down power voltage Vint is kept constant as shown in FIG. 8 while being higher than the reference level REF.

However, if the external power voltage Vcc becomes lower than the reference level REF, the step-down power voltage Vint follows the external power voltage Vcc.

As will be better seen from the foregoing description, the decrement of the step-down power voltage Vint cancels an overshoot due to the current through the p-channel enhancement type variable load transistor 12f, and the internal power supply system 12 keeps the step-down power voltage Vint constant in so far as the external power voltage Vcc is higher than the reference level REF. For this reason, the step-down power voltage Vint does not decrease the voltage margin for the component circuits, and any malfunction never take place.

Although particular embodiments of the present invention have been shown and described, it will be obvious to those skilled in the art that various changes and modifications may be made without departing from the spirit and scope of the present invention. For example, the internal power supply system according to the present invention is applicable to any integrated circuit device using a step-down power voltage.

What is claimed is:

1. An integrated circuit device fabricated on a single semiconductor chip, comprising:
   a) a main circuit for achieving a predetermined function; and
   b) a power supply system associated with said main circuit, and comprising
      b-1) a reference voltage producing means for producing a reference voltage from an external power voltage on an external power supply line,
      b-2) a voltage comparator having a first input node supplied with said reference voltage and a second input node coupled with an output node thereof, and operative to produce a first gate control signal for eliminating a difference between said reference voltage and a voltage level at said output node,
      b-3) a first variable load transistor coupled between said external power supply line and an internal power supply line for producing a step-down power voltage, and responsive to said first gate control signal for changing a channel resistance thereof, thereby keeping said step-down power voltage constant,
      b-4) a voltage detecting circuit monitoring said internal power supply line to determine whether or not said step-down power voltage has decayed to a critical level, and operative to produce a second gate control signal when said step-down power voltage reaches said critical level, said critical level being inversely proportional to said external power voltage level while said external power voltage is higher than said reference voltage, said voltage detecting circuit including a variable voltage generator supplied with said external power voltage level and said reference voltage for producing said critical level, and a voltage comparing unit supplied with said step-down power voltage and said critical level for producing said second gate control signal, and
      b-5) a second variable 10ad transistor coupled between said external power supply line and said internal power supply line, and responsive to said second gate control signal for supplementing current to said internal power supply line.

2. An integrated circuit device as set forth in claim 1, in which said main circuit is implemented by a dynamic random access memory cell array and peripheral circuits associated with said dynamic random access memory cell array.

3. An integrated circuit device as set forth in claim 1, in which said variable voltage generator comprises a voltage divider coupled between said external power supply line and an output node of said variable voltage generator and having a reference node for producing a step-down voltage following said external power voltage level, a first voltage comparator having a non-inverted input node coupled with said reference node and an inverted input node supplied with said reference voltage for producing a third gate control signal, and a combination of a third variable load transistor, said output node of said variable voltage generator and a first resistor coupled between said external power supply line and a constant voltage line and responsive to said third gate control signal for producing said critical level.

4. An integrated circuit device as set forth in claim 3, in which said voltage divider is implemented by a series combination of second and third resistors much larger in resistance than said first resistor, said output node of said variable voltage generator being provided between said first and third resistors.

5. An integrated circuit device as set forth in claim 3, in which said voltage comparing unit comprises a second voltage comparator having an inverted input node supplied with said critical level and a non-inverted input node supplied with said step-down power voltage, a third voltage comparator having a non-inverted input node supplied with said critical level and a non-inverted input node supplied with said step-down power voltage, a fourth voltage comparator having an inverted input node coupled with an output node of said second Voltage comparator and a non-inverted input node coupled with an output node of said third voltage comparator, and an inverter coupled with an output node of said fourth voltage comparator for producing said second gate control signal.

* * * * *